US012396115B2

(12) United States Patent
Hicks

(10) Patent No.: US 12,396,115 B2
(45) Date of Patent: Aug. 19, 2025

(54) JUNCTION BOX ASSEMBLY HAVING A RIB FOR WATER MITIGATION

(71) Applicant: Sumitomo Wiring Systems, Ltd., Yokkaichi (JP)

(72) Inventor: Cody Hicks, Farmington Hills, MI (US)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 399 days.

(21) Appl. No.: 18/186,276

(22) Filed: Mar. 20, 2023

(65) Prior Publication Data

US 2024/0324133 A1    Sep. 26, 2024

(51) Int. Cl.
*H05K 5/06* (2006.01)
*H05K 5/02* (2006.01)
*H05K 5/03* (2006.01)

(52) U.S. Cl.
CPC .......... *H05K 5/063* (2013.01); *H05K 5/0217* (2013.01); *H05K 5/03* (2013.01)

(58) Field of Classification Search
CPC ........ H05K 5/063; H05K 5/0217; H05K 5/03; H02G 3/08; H02G 3/081; B60R 16/0239
See application file for complete search history.

(56) References Cited

U.S. PATENT DOCUMENTS

| 7,544,887 | B2* | 6/2009 | Iizuka | H02G 3/081 |
| | | | | 174/58 |
| 8,915,394 | B2* | 12/2014 | I | B60R 16/0239 |
| | | | | 220/378 |
| 9,431,806 | B2* | 8/2016 | Ueyama | B60R 16/0238 |
| 9,623,816 | B2* | 4/2017 | Maebashi | B60R 16/0238 |
| 10,064,300 | B2* | 8/2018 | I | H05K 5/06 |
| 11,329,465 | B2* | 5/2022 | Kawamura | H01R 13/5213 |
| 2013/0034974 | A1* | 2/2013 | Akahori | H01R 9/2458 |
| | | | | 439/76.2 |
| 2017/0070040 | A1* | 3/2017 | Kawada | H02G 3/081 |
| 2019/0348826 | A1* | 11/2019 | Ikeda | B60R 16/0207 |
| 2019/0376542 | A1* | 12/2019 | Kawamura | B60R 16/0238 |
| 2019/0379194 | A1* | 12/2019 | Kawamura | B60R 16/0239 |
| 2021/0083463 | A1 | 3/2021 | Washihira et al. | |
| 2023/0365079 | A1* | 11/2023 | Wada | B60R 16/0239 |

* cited by examiner

*Primary Examiner* — Sagar Shrestha
(74) *Attorney, Agent, or Firm* — Honigman LLP

(57) ABSTRACT

A junction box assembly and an upper case is provided. The upper case includes a peripheral wall and an interior wall having an outer wall and an inner wall. The outer wall is dimensioned to define a u-shaped structure. The inner wall is dimensioned to define a closed loop. The inner wall is disposed within and spaced apart from the outer wall. The upper case further includes a rib disposed on an outer surface of an inner back wall. The rib extends longitudinally along the inner back wall and is dimensioned to contact an inner surface of a top cover of the junction box assembly so as to prevent water from entering the upper case.

20 Claims, 7 Drawing Sheets

JUNCTION BOX ASSEMBLY HAVING A RIB FOR WATER MITIGATION

TECHNICAL FIELD

This disclosure relates to a junction box assembly having an outer wall and a rib configured to prevent water from entering the junction box.

BACKGROUND

With reference now to FIG. 1, a conventional junction box assembly 500 is provided. The junction box assembly 500 includes an upper case 502 and a lower case 504. The upper case 502 includes an outer wall 506 that bounds an inner wall 508. The inner wall 508 includes a first wall 508a spaced apart from a second wall 508b so as to form a double-wall structure. The outer wall 506 forms a continuous loop and the inner wall 508 forms a continuous loop. The inner wall 508 is spaced apart from the outer wall 506 to form a groove 510. The groove 510 is a continuous loop and is configured to prevent water from entering the interior space of the upper case 502.

With reference now to FIG. 2, the upper case 502 is covered by a top cover 512 which is configured to prevent water from entering the upper case 502. The top cover 512 includes a top wall 514 and an outer lip 516. The top wall 514 is a generally planar member having a surface area configured to cover the top of the upper case 502. The outer lip 516 bounds the top wall 514 so as to surround a top portion of the periphery of the upper case 502 when the top cover 512 is mounted onto the upper case 502. The top cover 512 includes a pair of interior panels 516a, 516b. Interior panel 516b has a generally smooth and continuous exterior surface and is fitted between a first wall 508a and a second wall 508b.

With the increase of electrification, additional electric components may be required; however, the cross-sectional area of the junction box assembly must remain the same to accommodate packaging requirements. In such an event, a portion of the inner wall 514 is removed, which eliminates a corresponding portion of the groove 510, which degrades the water mitigation. As a result, water may enter the space between the first wall 508a and interior panel 516b and flow into the space where electric components reside, as indicated by the arrow. In such an event, the electric components stored in the junction box assembly 500 may be damaged.

Accordingly, it remains desirable to have a junction box assembly configured to prevent water from entering the space where electric components reside.

SUMMARY

In one aspect, an upper case is provided. The upper case is configured to accommodate electronic components. The upper case includes a peripheral wall defining a periphery of the upper case. The peripheral wall bounds a space for accommodating the electronic components. The peripheral wall includes a back wall, a pair of side walls, and a front wall. The upper case further includes an interior wall disposed within the peripheral wall. The interior wall is spaced apart from an interior surface of the peripheral wall. The interior wall includes an outer wall and an inner wall. The outer wall includes a pair of outer side walls, an outer front wall, and an open back portion so as to define a u-shaped structure. The inner wall includes an inner front wall, a pair of inner side walls, and an inner back wall so as to define a closed loop. The inner wall is disposed within and spaced apart from the outer wall to define a groove having a u-shape. The upper case further includes a rib disposed on an outer surface of the inner back wall. The outer surface is opposite of an inner surface of the peripheral wall. The rib extends longitudinally along the inner back wall.

In one aspect, the inner back wall extends beyond a distal end of the pair of outer side walls. In such as aspect, the inner wall may include a pair of inner legs, a pair of projections, and a back wall portion and the rib is disposed on the back wall portion. Optionally, one of the pair of inner legs is disposed on a distal end of one of the pair of inner side walls and the other of the pair of legs is disposed on a distal end of the other one of the pair of inner side walls, the pair of legs extending towards each other. In such an aspect, one of the pair of projections is disposed on a distal end of one of the pair of legs and the other of the pair of projections is disposed on a distal end of the other one of the pair of legs. The back wall portion may interconnect the pair of projections to each other.

In another aspect, the upper case may further include a drain hole disposed underneath the rib.

In another aspect, the rib is disposed on a top portion of the inner back wall. Alternatively or in addition, the rib may be spaced apart from a top surface of the inner back wall. The rib may be continuous from a first end of the inner back wall to a second end of the inner back wall.

In yet another aspect of the disclosure, a junction box assembly is provided. The junction box assembly is configured to accommodate electronic components. The junction box assembly includes a top cover having a top wall and a lip which bounds a periphery of the top wall. The junction box assembly further includes an upper case. The upper case includes a peripheral wall and an interior wall. The peripheral wall defines a periphery of the upper case. The peripheral wall bounds a space for accommodating the electronic components. The outer wall includes a back wall, a pair of side walls, and a front wall.

The interior wall is disposed within the peripheral wall and spaced apart from an interior surface of the peripheral wall. The interior wall includes an outer wall and an inner wall. The outer wall includes a pair of outer side walls, an outer front wall and an open back portion so as to define a u-shaped structure. The inner wall includes an inner front wall, a pair of inner side walls, and an inner back wall so as to define a closed loop. The inner wall is disposed within and spaced apart from the outer wall to define a groove having a u-shape. The upper case further includes a rib disposed on an outer surface of the inner back wall. The outer surface is opposite an inner surface of the peripheral wall. The rib extends longitudinally along the inner back wall and contacts the lip of the top cover so as to prevent water from entering the upper case.

In one aspect, the inner back wall extends beyond a distal end of the pair of outer side walls. In such an aspect, the inner wall includes a pair of inner legs, a pair of projections, and a back wall portion. The rib is disposed on the back wall portion. One of the pair of inner legs may be disposed on a distal end of one of the pair of inner side walls and the other of the pair of legs may be disposed on a distal end of the other one of the pair of inner side walls. The pair of legs may extend towards each other. In such an aspect, one of the pair of projections is disposed on a distal end of one of the pair of legs and other of the pair of projections is disposed on a distal end of the other one of the pair of legs. The back wall portion may interconnect the pair of projections to each other so as to form the closed loop.

In another aspect, the upper case may further include a drain hole disposed underneath the rib.

In yet another aspect, wherein the rib is disposed on a top portion of the inner back wall. Alternatively or in addition, the rib may be spaced apart from a top surface of the inner back wall. The rib may be continuous from a first end of the inner back wall to a second end of the inner back wall.

Accordingly, an upper case and a junction box is provided which includes a rib configured to prevent water from entering the upper case so as to protect the electric components housed in the upper case.

DETAILED DESCRIPTION

Figure 1:
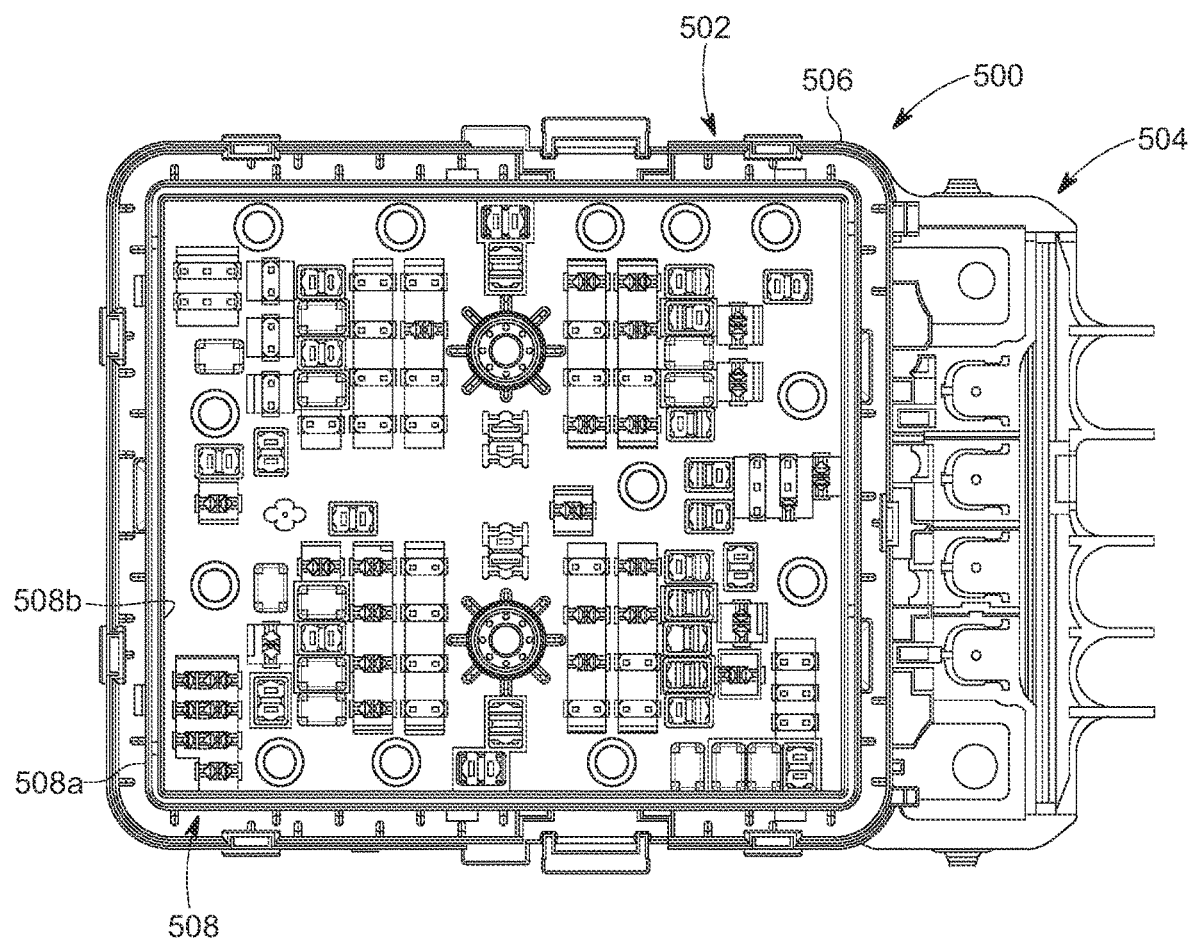
FIG. 1 is a top down view of a conventional junction box assembly.
Figure 2:
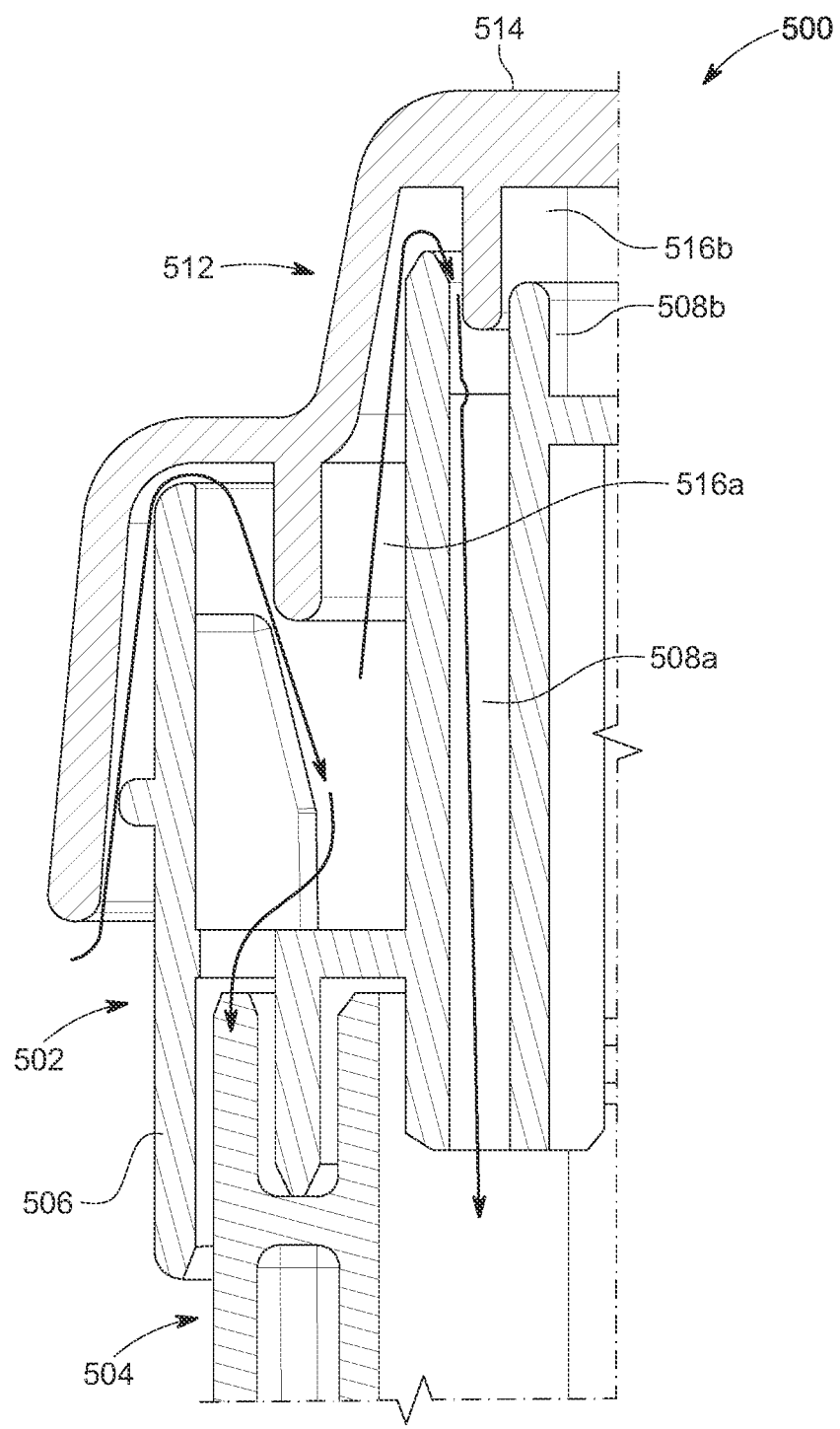
FIG. 2 is a partial cross-sectional view of the junction box assembly shown in FIG. 1 with a top cover.

A junction box assembly and an upper case is provided. The upper case is dimensioned to accommodate electronic components. The upper case includes a peripheral wall and an interior wall. The peripheral wall defines a periphery of the upper case and the interior wall is disposed within and spaced apart from an interior surface of the peripheral wall. The interior wall includes an outer wall and an inner wall. The outer wall is dimensioned to define a u-shaped structure. The inner wall is dimensioned to define a closed loop. The inner wall is disposed within and spaced apart from the outer wall to define a groove having a u-shape. The upper case further includes a rib disposed on an outer surface of an inner back wall. The rib extends longitudinally along the inner back wall and is dimensioned to contact an inner surface of a top cover of the junction box assembly so as to prevent water from entering the upper case.

Directional terms as used herein—for example "up", "down", "right", "left", "front", "back", "top", "bottom"—are made only with reference to the figures as drawn and are not intended to imply absolute orientation. As such, terms such as "upper", "lower", "height" and "width" are taken in context of the directional terms and the drawings.

With reference now to FIGS. 3-7 an illustrative depiction of a junction box assembly 100 according to one or more embodiments disclosed herein is provided. The junction box assembly 100 includes a junction box 10 having an upper case 12 and a lower case 14. The junction box assembly 100 may further include a top cover 16 configured to cover the upper case 12. The upper case 12, the lower case 14, and the top cover 16 may be formed of any material suitable for injection molding, illustratively including polypropylene, Acrylonitrile butadiene styrene, polyoxymethylene, polycarbonate, and the like.

The Upper Case

The upper case 12 is shown as being generally rectangular; however, it should be appreciated that the dimensions of the upper case 12 may deviate from what is shown without limiting the scope of the appended claims. The upper case 12 includes a peripheral wall 18 bounding an interior space 20 for accommodating electronic components 22a. Some of the electronic components 22a are mounted on a circuit board 22b which is generally seated into the upper case 12 from the bottom of the upper case 12. Additional electronic components (not shown), such as terminal pins, fuses, and relays may be mounted onto the electronic components mounted on the circuit board from the top of the upper case 12.

The peripheral wall 18 is a generally planar member forming a continuous loop. The peripheral wall 18 includes a front wall 18a, a pair of side walls 18b, 18c, and a back wall 18d which are generally the same height. The back wall 18d defines a back of the junction box 10, the side walls 18b, 18c form a respective left and right side of the junction box 10, and the front wall 18a forms the front of the junction box 10, as indicated by the directional arrows shown in FIG. 3. An exterior surface of the peripheral wall 18 may include attachment features for coupling with the top cover 16 and the lower case 14. Such attachment features are well known, and any attachment feature currently known or later developed may be modified for incorporation herein.

The upper case 12 further includes an interior wall 24 disposed within the peripheral wall 18. The interior wall 24 is spaced apart from an interior surface of the peripheral wall 18. The interior wall 24 includes an outer wall 26 and an inner wall 28. The outer wall 26 and the inner wall 28 are generally planar members which extend upright from a bottom wall 30 of the upper case 12. The outer wall 26 includes an outer front wall 26a, a pair of outer side walls 26b, 26c, and an open back portion 26d so as to define a u-shaped structure. The inner wall 28 includes an inner back wall 28d, a pair of inner side walls 28b, 28c, and an inner front wall 28d so as to define a closed loop bounding a storage space 20a of the upper case 12. The electronic components are disposed in the storage space 20a.

The inner wall 28 is disposed within and spaced apart from the outer wall 26 to define a groove 32 having a u-shape. The groove 32 has a generally constant width and height and is open at the distal ends of the groove 32. The groove 32 is configured to collect water so as to prevent water from entering the storage space 20a of the upper case 12 and damaging the electronic components disposed therein. A pair of first drain holes 34 may be disposed within the groove 32 so as to allow water to drain to the environment.

Figure 4:
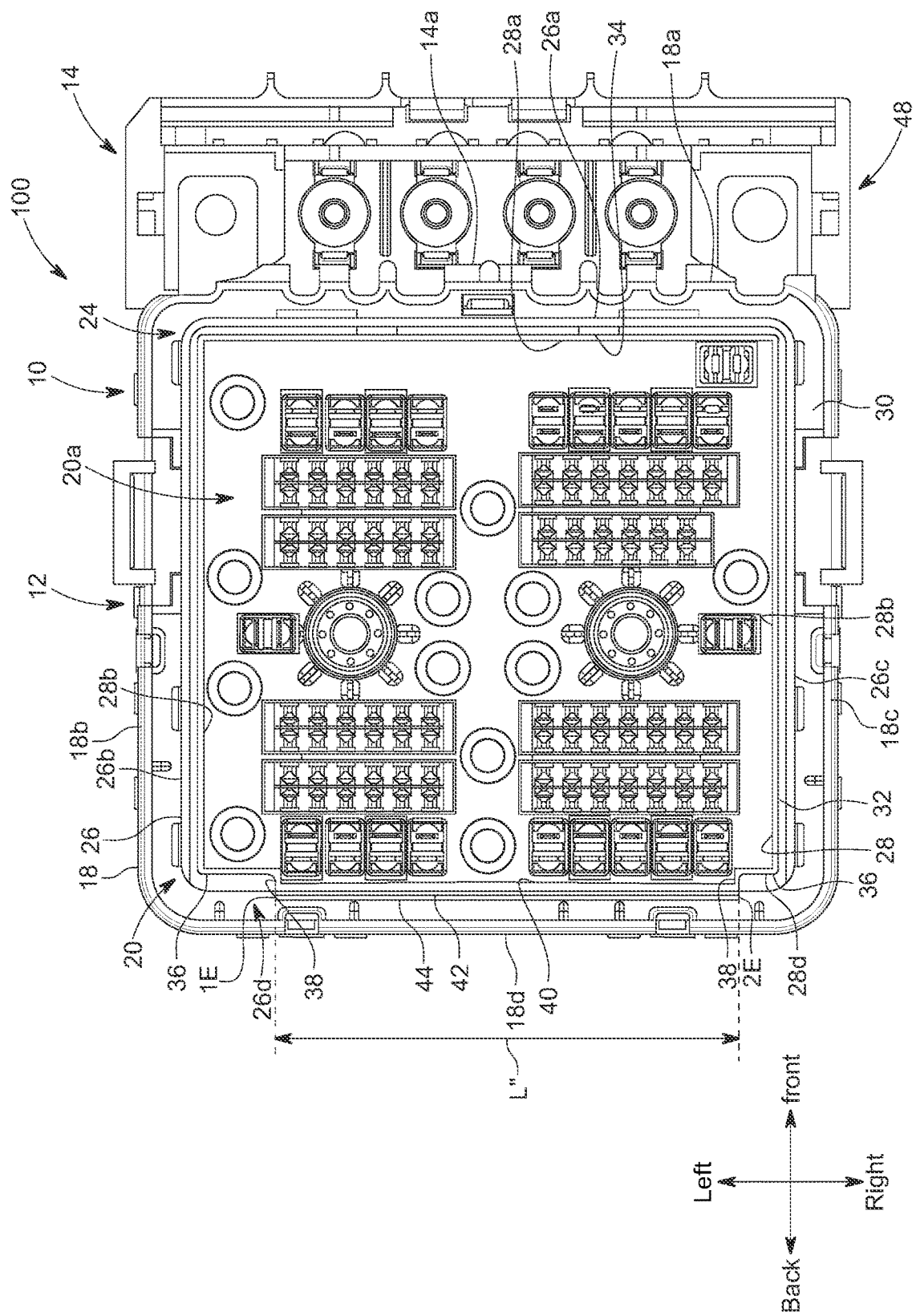
FIG. 4 is a view of FIG. 3 showing the top cover removed.
Figure 5:
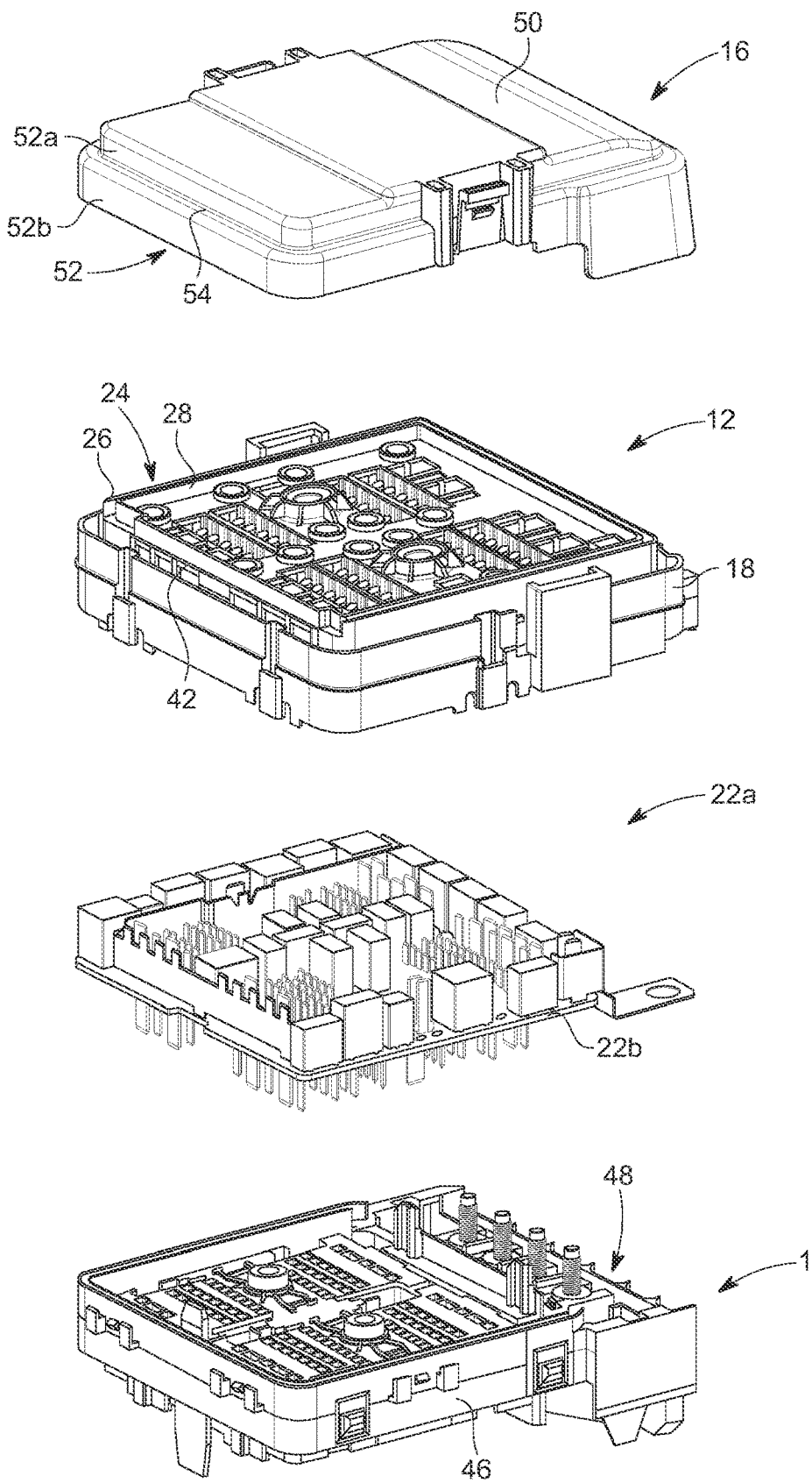
FIG. 5 is an exploded view of FIG. 3.

With reference now to FIG. 4, the inner back wall 28d of the inner wall 28 extends beyond a distal end of the pair of outer side walls 26b, 26c of the outer wall 26. In one embodiment, the inner wall 28 includes a pair of inner legs 36, a pair of projections 38, and a back wall portion 40 connected together to form a u-shape. The inner legs 36, the projections 38 and the back wall portion 40 are elongated planar sheet-like structures. In particular, each inner leg 36 is disposed on a distal end of a corresponding inner side walls 28b, 28c of the inner wall 28 and is generally orthogonal to the corresponding inner side walls 28b, 28c. The pair of inner legs 36 extend towards each other.

The projections 38 are disposed on a distal end of a corresponding inner leg 36. The projections 38 are orthogonal to the corresponding inner leg 36 and have a thickness that is generally the same as a thickness of the inner leg 36. The back wall portion 40 interconnects the pair of projections 38 to each other so as to form a closed loop with the inner side walls 28b, 28c and the inner front wall 28a of the inner wall 28.

The upper case 12 further includes a rib 42 disposed on an outer surface of the inner back wall 28d. The outer surface of the inner back wall 28d is opposite of an inner surface of the peripheral wall 18. The rib 42 extends longitudinally along the inner back wall 28*d*. The rib 42 may be disposed on a top portion of the inner back wall 28*d*. In one aspect, the rib 42 is spaced apart from a top surface of the inner back wall 28*d*. Preferably, the rib 42 is continuous from a first end (1E) of the inner back wall 28*d* to a second end (2E) of the inner back wall 28*d*. The rib 42 includes a thickness which may be uniform along the length of the rib 42.

Figure 3:
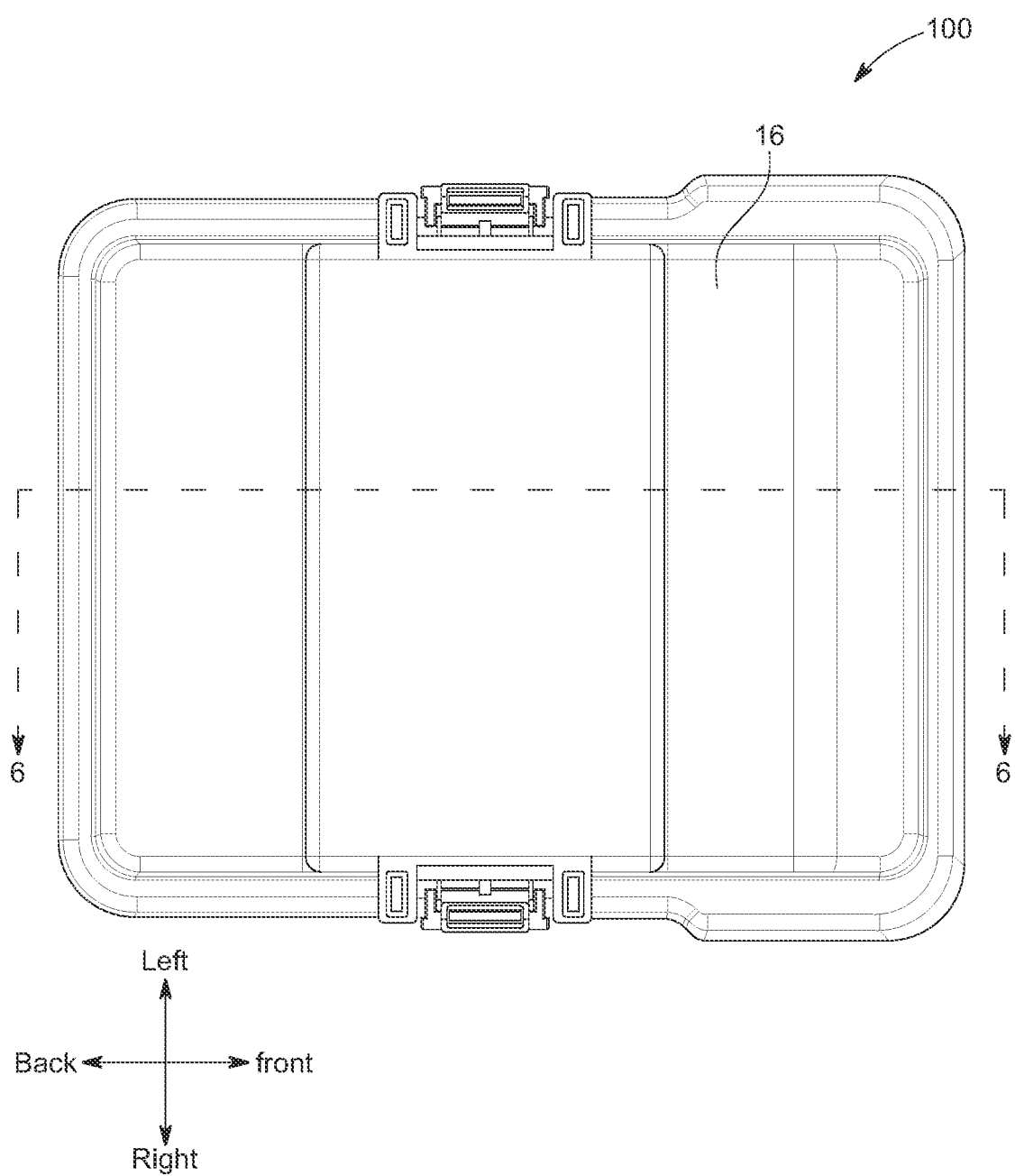
FIG. 3 is a top down view of a junction box assembly according to the principles of the present disclosure.
Figure 6:
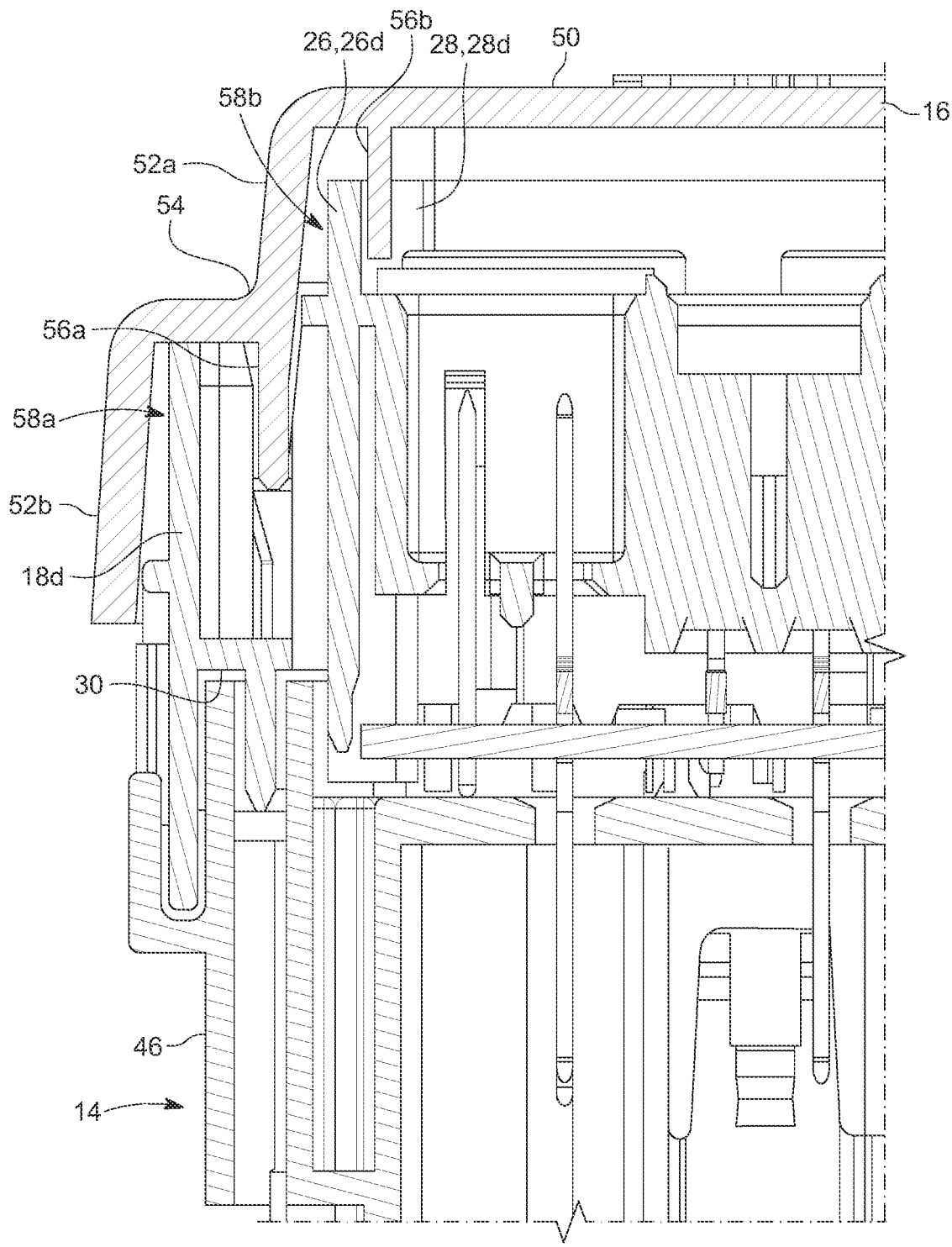
FIG. 6 is a cross-sectional view of FIG. 3 taken along line 6-6.

The upper case 12 further includes a bottom wall 30. The bottom wall 30 is formed on a bottom of the upper case 12 and extends between the peripheral wall 18 and the inner wall 28. The bottom wall 30 is a planar sheet-like structure which forms a continuous loop bounding the inner wall 28. The bottom wall 30 includes a second drain hole 44 disposed on a back side of the upper case 12 underneath the rib 42. The second drain hole 44 extends through the bottom wall 30. The second drain hole 44 may have a width (W2) greater than a width of the rib 42 (W1), as shown in FIG. 6. The second drain hole 44 may be a continuous elongated hole having a length greater than a length of the rib 42, as shown in FIG. 3.

The Lower Case

With reference again to FIGS. 4-7, an illustrative depiction of the lower case 14 is provided. The lower case 14 is configured to be seated underneath the upper case 12. The lower case 14 includes a lower outer wall 46, which bounds the periphery of the lower case 14.

The lower case 14 further includes a terminal support portion 48. The terminal support portion 48 is illustratively shown as being a cuboidal member disposed on a front portion 14*a* of the lower case 14 and projects beyond the front wall 18*a* of the peripheral wall 18 of the upper case 12. The terminal support portion 48 is a platform for supporting one end of a terminal (not shown) which is electrically coupled to an electric device on the other end. The terminal themselves are electrically conductive members which are connected to predetermined electrical components disposed within both the storage space 20*a* of the upper case 12 and the lower case 14. The terminals are configured to engage a stud so as to secure the terminal to a predetermined position within the terminal support portion 48.

The Top Cover

The top cover 16 includes a top wall 50 and a lip 52, which bounds the periphery of the top wall 50. The top wall 50 is a generally planar member having a surface area which is greater than the surface area of the upper case 12 so as to cover the interior space 20 and the storage space 20*a* of the upper case 12. The lip 52 projects downwardly from the periphery of the top cover 16 and may include a shoulder portion 54 so as to define an upper lip portion 52*a* and a lower lip portion 52*b*, wherein the lower lip portion 52*b* is laterally offset from the upper lip portion 52*a*.

The interior surface of the top cover 16 may include a plurality of interior panels 56 which project downwardly from the interior surface of the top cover 16. In one aspect, the top cover 16 includes a first interior panel 56*a* and a second interior panel 56*b* spaced apart from the first interior panel 56*a*. The first interior panel 56*a* and the second interior panel 56*b* extend continuously along the interior surface of the top cover 16 to form a loop. The first interior panel 56*a* is disposed within an outer gap 58*a* disposed between the peripheral wall 18 and the outer wall 26 of the interior wall 24, and the second interior panel 56*b* is disposed behind the back wall portion 40 of the inner wall 28. Accordingly, the back wall portion 40 is disposed between the first interior panel 56*a* and the second interior panel 56*b*, as shown in FIG. 6.

Figure 7:
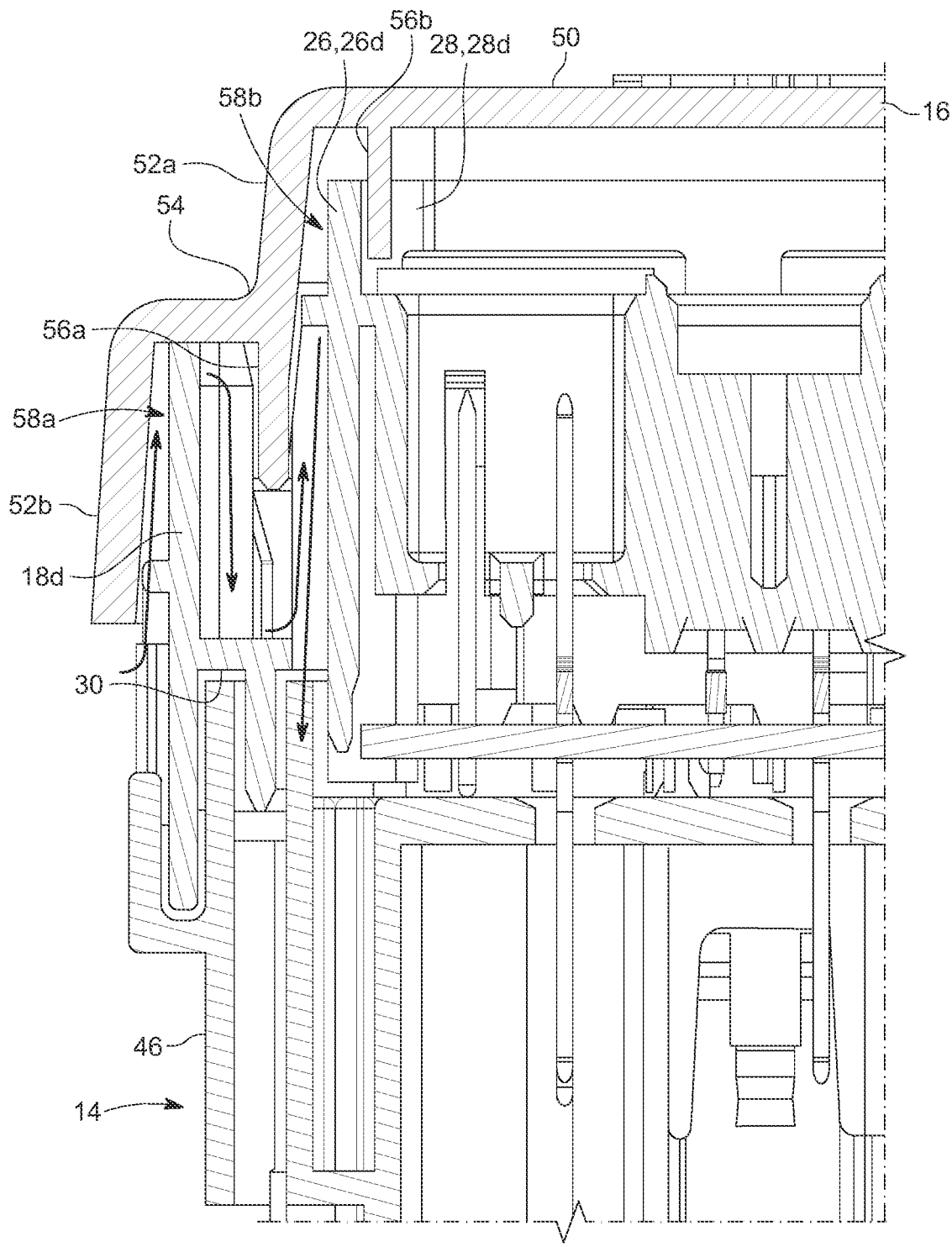
FIG. 7 is a view of FIG. 6 showing the path of water.

With reference now to FIG. 7, an operation of the junction box assembly 100 is provided. The upper case 12 is attached to the lower case 14 by a stud extending through the upper and lower case 14. The top cover 16 is seated onto the upper case 12 and may be secured to the upper case 12 by attachment features, such as snap-fit tabs. When properly seated, the lip 52 of the top cover 16 surrounds an upper portion of the peripheral wall 18 and the top surface of the peripheral wall 18 is pressed against the interior surface of the shoulder portion 54.

The first interior panel 56*a* is disposed within the outer gap and an interior surface of the upper lip portion 52*a* is seated against the rib 42. FIG. 7 shows the path of water, as illustrated by directional arrows, entering the junction box assembly 100. As shown, the water path is indicative of water splashing up into the junction box assembly 100 between the lower lip 52 of the top cover 16 and the peripheral wall 18. Water splashing upwardly from the bottom wall 30 is blocked by the rib 42 and directed down into the second drain hole 44. Water escapes the upper case 12 through the second drain hole 44 through a gap in the lower case 14 and into the environment. Accordingly, an upper case 12 and a junction box 10 is provided which includes a rib 42 configured to prevent water from entering the interior space 20 of the upper case 12 and allow for water to drain through the upper case 12 into the environment.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An upper case for accommodating electronic components, the upper case comprising:
    a peripheral wall defining a periphery of the upper case, the peripheral wall bounding a space for accommodating the electronic components, the peripheral wall including a back wall, a pair of side walls and a front wall;
    an interior wall disposed within the peripheral wall and spaced apart from an interior surface of the peripheral wall, the interior wall including an outer wall and an inner wall, the outer wall having a pair of outer side walls, an outer front wall and an open back portion so as to define a u-shaped structure, the inner wall including an inner front wall, a pair of inner side walls and an inner back wall so as to define a closed loop, the inner wall disposed within and spaced apart from the outer wall to define a groove, the groove have a u-shape; and
    a rib disposed on an outer surface of the inner back wall, the outer surface opposite an inner surface of the peripheral wall, the rib extending longitudinally along the inner back wall.

2. The upper case as set forth in claim 1, wherein the inner back wall extends beyond a distal end of the pair of outer side walls.

3. The upper case as set forth in claim 1, wherein the inner wall includes a pair of inner legs, a pair of projections and a back wall portion, the rib disposed on the back wall portion.

4. The upper case as set forth in claim 3, wherein one of the pair of inner legs is disposed on a distal end of one of the pair of inner side walls and the other of the pair of inner legs is disposed on a distal end of the other one of the pair of inner side walls, the pair of inner legs extending towards each other.

5. The upper case as set forth in claim 4, wherein the one of the pair of projections is disposed on a distal end of one of the pair of inner legs and other of the pair of projections is disposed on a distal end of the other one of the pair of inner legs.

6. The upper case as set forth in claim 5, wherein the back wall portion interconnects the pair of projections to each other.

7. The upper case as set forth in claim 1, further including a drain hole disposed underneath the rib.

8. The upper case as set forth in claim 1, wherein the rib is disposed on a top portion of the inner back wall.

9. The upper case as set forth in claim 1, wherein the rib is spaced apart from a top surface of the inner back wall.

10. The upper case as set forth in claim 1, wherein the rib is continuous from a first end of the inner back wall to a second end of the inner back wall.

11. A junction box assembly for accommodating electronic components, the junction box assembly comprising:
  a top cover having a top wall and a lip bounding a periphery of the top wall; and
  an upper case including a peripheral wall and an interior wall, the peripheral wall defining a periphery of the upper case, the peripheral wall bounding a space for accommodating the electronic components, the peripheral wall including a back wall, a pair of side walls and a front wall, the interior wall disposed within the peripheral wall and spaced apart from an interior surface of the peripheral wall, the interior wall including an outer wall and an inner wall, the outer wall having a pair of outer side walls, an outer front wall and an open back portion so as to define a u-shaped structure, the inner wall including an inner front wall, a pair of inner side walls and an inner back wall so as to define a closed loop, the inner wall disposed within and spaced apart from the outer wall to define a groove, the groove have a u-shape, the upper case further including a rib disposed on an outer surface of the inner back wall, the outer surface opposite an inner surface of the peripheral wall, the rib extending longitudinally along the inner back wall and contacting the lip of the top cover so as to prevent water from entering the upper case.

12. The junction box assembly as set forth in claim 11, wherein the inner back wall extends beyond a distal end of the pair of outer side walls.

13. The junction box assembly as set forth in claim 11, wherein the inner wall includes a pair of inner legs, a pair of projections and a back wall portion, the rib disposed on the back wall portion.

14. The junction box assembly as set forth in claim 13, wherein one of the pair of inner legs is disposed on a distal end of one of the pair of inner side walls and the other of the pair of inner legs is disposed on a distal end of the other one of the pair of inner side walls, the pair of inner legs extending towards each other.

15. The junction box assembly as set forth in claim 14, wherein the one of the pair of projections is disposed on a distal end of one of the pair of inner legs and other of the pair of projections is disposed on a distal end of the other one of the pair of inner legs.

16. The junction box assembly as set forth in claim 15, wherein the back wall portion interconnects the pair of projections to each other.

17. The junction box assembly as set forth in claim 11, further including a drain hole disposed underneath the rib.

18. The junction box assembly as set forth in claim 11, wherein the rib is disposed on a top portion of the inner back wall.

19. The junction box assembly as set forth in claim 11, wherein the rib is spaced apart from a top surface of the inner back wall.

20. The junction box assembly as set forth in claim 11, wherein the rib is continuous from a first end of the inner back wall to a second end of the inner back wall.

* * * * *